(12) United States Patent
Chang et al.

(10) Patent No.: US 7,045,441 B2
(45) Date of Patent: May 16, 2006

(54) METHOD FOR FORMING A SINGLE-CRYSTAL SILICON LAYER ON A TRANSPARENT SUBSTRATE

(75) Inventors: Chich Shang Chang, Taoyuan (TW); Chi-Shen Lee, Hsinchu (TW); Shun-Fa Huang, Changhua (TW); Jung Fang Chang, Tainan (TW); Wen-Chih Hu, Hsinchu (TW); Liang-Tang Wang, Tainan (TW); Chai-Yuan Sheu, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 218 days.

(21) Appl. No.: 10/628,893

(22) Filed: Jul. 28, 2003

(65) Prior Publication Data

US 2004/0180518 A1  Sep. 16, 2004

(30) Foreign Application Priority Data

Mar. 13, 2003  (TW) .............................. 92105465 A

(51) Int. Cl.
*H01L 21/762*  (2006.01)
*H01L 23/15*  (2006.01)
(52) U.S. Cl. ...................... 438/458; 438/459; 438/795; 438/977; 257/E21.658
(58) Field of Classification Search ................ 438/458, 438/459, 977, FOR. 477, FOR. 485, 795; 148/DIG. 12; 257/E21.658
See application file for complete search history.

(56) References Cited

U.S. PATENT DOCUMENTS

| | | | |
|---|---|---|---|
| 6,372,608 B1* | 4/2002 | Shimoda et al. | 438/455 |
| 6,387,829 B1* | 5/2002 | Usenko et al. | 438/120 |
| 6,846,703 B1* | 1/2005 | Shimoda et al. | 438/109 |
| 6,849,877 B1* | 2/2005 | Yamazaki et al. | 257/86 |
| 6,875,671 B1* | 4/2005 | Faris | 438/455 |
| 2001/0026997 A1* | 10/2001 | Henley et al. | 438/458 |
| 2002/0106870 A1* | 8/2002 | Henley et al. | 438/464 |
| 2004/0056332 A1* | 3/2004 | Bachrach et al. | 257/640 |
| 2004/0142542 A1* | 7/2004 | Murphy et al. | 438/479 |
| 2004/0253794 A1* | 12/2004 | Faris | 438/459 |

* cited by examiner

Primary Examiner—George Fourson
(74) Attorney, Agent, or Firm—Quintero Law Office

(57) ABSTRACT

A method for forming a, single-crystal silicon layer on a transparent substrate. A transparent substrate having an amorphous silicon layer formed thereon and a silicon wafer having a hydrogen ion layer formed therein are provided. The silicon wafer is then reversed and laminated onto the amorphous silicon layer so that a layer of single-crystal silicon is between the hydrogen ion layer and the amorphous silicon layer. The laminated silicon wafer and the amorphous silicon layer are then subjected to laser or infrared light to cause chemical bonding of the single crystal silicon layer and the amorphous silicon layer and inducing a hydro-cracking reaction thereby separating the silicon wafer is and the transparent substrate at the hydrogen ion layer, and leaving the single-crystal silicon layer on the transparent substrate.

6 Claims, 1 Drawing Sheet

METHOD FOR FORMING A SINGLE-CRYSTAL SILICON LAYER ON A TRANSPARENT SUBSTRATE

BACKGROUND OF THE INVENTION

1. Field of the Invention

The present invention relates to a lamination method for a transparent substrate, and in particular to a method for forming a single-crystal silicon layer on a transparent substrate.

2. Description of the Related Art

In addition to developing flat panel displays with greater display areas, the lighter, thinner, and more flexible characteristics of flat panel displays have also become desirable. One current trend is to substitute glass substrates with plastic substrates. However, many problems, such as low $T_g$, arise when using plastic substrates, which hinder the required high temperature process, resulting in poor panel performance. Moreover, plastic substrates are poorly suited to the manufacturing process, which induces severe stress, static and large thermal expansion coefficient. Other alternative substrate materials include metal, or metal alloy, such as aluminum, titanium or similar. Use of these substrate materials have the advantages of light weight, flexibility, high melting point, no static, lower thermal expansion coefficient, and lower cost. Therefore, these materials demonstrate great potential for use as substrates in flexible reflective panel displays. However, these flexible metal substrates cannot be incorporated into the current process and equipment. Glass must be used as a carrier, which is problematic as it requires temporary lamination of metal with glass, which must be separated in a subsequent step.

Current methods for temporary lamination mostly use a high molecular gel, which due to its poor resistance to high temperature, is not suitable for laminating metal and glass. Another lamination material for metal and glass is high temperature silver gel. Coating silver gel, however, is difficult and is not cost effective. As a result, silver gel is not a satisfactory laminating material.

In addition, current methods cannot directly form a single-crystal silicon layer on a transparent substrate (such as glass), as glass is amorphous and exhibit a melting point of 600° C. If molecular beam epitaxy (MBE) is utilized to directly grow a single-crystal silicon layer, temperature must be between 700 and 800° C., or even higher. Therefore, traditional methods use anodic bonding to tightly bond a glass substrate and a single-crystal silicon substrate, followed by a polish and etching method to remove excess single-crystal silicon.

Switching elements of TFT-LCD products in the current market are mostly amorphous silicon thin film transistors (α-TFTs). For some high-end products, such as panels for digital cameras or projectors, low temperature polysilicon (LTPSS) or high temperature polysilicon (HTP) are usually adopted as switching elements. However, the electron mobility of a single-crystal silicon film is greater than 600 cm$^2$/Vs, much greater than that of polysilicon thin film (100~300 cm$^2$/Vs) and amorphous silicon thin film (~0.5 cm$^2$/Vs). Hence, if a single-crystal silicon thin film is formed on a glass substrate, the performance of TFT elements can be greatly enhanced. In addition, related circuits can be integrated as system on panel (SOP). Glass substrates having elements formed thereon are desirable not only for applications in panel displays, but also for biochip, optic microsensors, or various integrated microelectrical products.

Hence, there is a need for a method for forming a single-crystal silicon layer on a transparent substrate.

SUMMARY OF THE INVENTION

Accordingly, an object of the invention is to provide a method for forming a single-crystal silicon layer on a transparent substrate.

In order to achieve the above objects, the main feature of the invention is the indirect heating by infrared or laser to bond an amorphous silicon layer and a single-crystal silicon layer together. In view of the fact that single-crystal silicon cannot directly grow on a transparent substrate, a transparent substrate having an amorphous silicon layer is provided instead. A silicon wafer, made of single-crystal silicon, having a hydrogen ion layer formed therein is also provided. The silicon wafer and the transparent substrate are then laminated together so that a single-crystal silicon layer (i.e. the part of the silicon wafer above the hydrogen ion layer) is between the hydrogen ion layer and the amorphous silicon layer. Infrared heating then induces chemical bonding of the amorphous silicon layer and the single-crystal silicon layer. Later in the process, when the heating reaches a certain temperature, a hydro-cracking reaction occurs so that the amorphous silicon and the silicon wafer separate at the hydrogen ion layer, leaving a single-crystal silicon layer on the amorphous silicon layer (i.e. the transparent substrate).

Major steps of the method of the invention are as follows. A transparent substrate having an amorphous silicon layer formed thereon and a silicon wafer having a hydrogen ion layer formed therein are provided. The silicon wafer is then reversed and laminated onto the amorphous silicon layer so that a layer of single-crystal silicon layer is between the hydrogen ion layer and the amorphous silicon layer. The laminated silicon wafer and the amorphous silicon layer are then subjected to laser or infrared light to cause chemical bonding between the single-crystal silicon layer and the amorphous silicon layer, and the hydro-cracking reaction thereby separates the silicon wafer and the transparent substrate at the hydrogen ion layer, and leaves the single-crystal silicon layer on the transparent substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

EXAMPLE

Figure 1A:
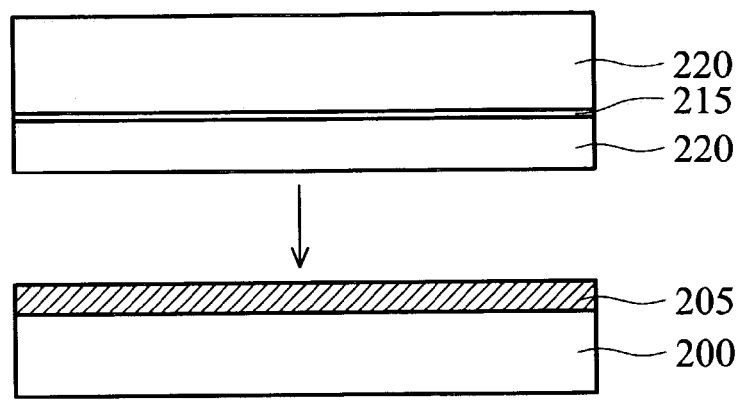
FIG. 1A~1C are cross sections of the embodiment of the invention.
Figure 1B:
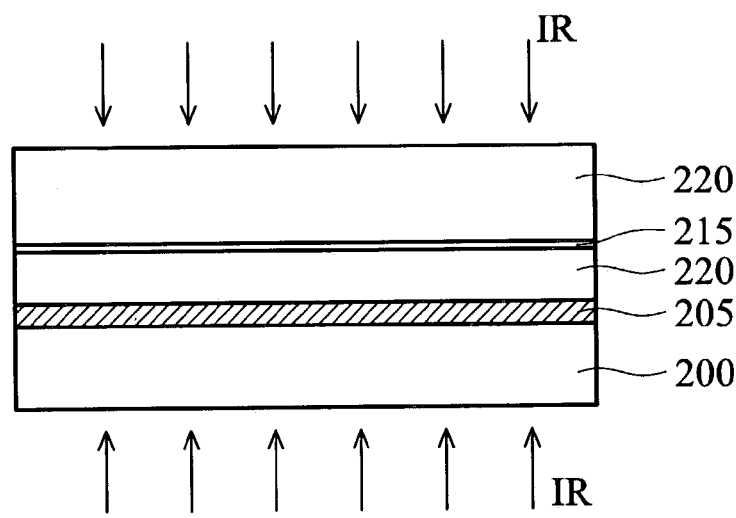
Figure 1C:
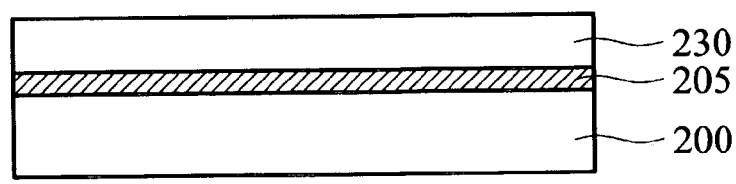

FIGS. 1A~1C illustrate cross sections of the embodiment of the invention.

In FIG. 1A, a transparent substrate 200 having an amorphous silicon layer 205 formed thereon and a silicon wafer 220 with a hydrogen ion layer 215 are provided. In this embodiment, glass is used as the transparent substrate 200. The hydrogen ion layer is formed by doping under the following conditions: dosage $1\times10^{16}$~$5\times10^{17}$ cm$^{-2}$; energy 10~1000 keV and doping depth of 0.1~15 μm.

Next, as shown in FIG. 1B, the silicon wafer 220 is inverted and laminated onto the amorphous silicon layer 205, followed by exposure to infrared (IR). At this stage, part of the silicon wafer is between the hydrogen ion layer 215 and the amorphous silicon layer 205. IR then passes through the non-infrared absorbent glass substrate 200 and the amorphous silicon layer 205 to cause chemical bonding of the infrared-absorbing single-crystal silicon and the amorphous silicon layer 205. When heating to a certain high temperature, a hydro-cracking reaction is induced at the hydrogen ion layer 215. As a result, the silicon wafer 220 separates from the glass substrate 200 at the hydrogen ion layer 215, leaving a layer of single-crystal silicon layer 230 on the glass substrate 200. That is, the depth of the hydrogen ion layer 215 in the silicon wafer determines the thickness of the single-crystal silicon layer 230 transferred to the glass substrate 200.

One advantage of the invention is that the silicon wafer 220 is reusable after detached from the amorphous silicon layer. In other words, the silicon wafer is the source of the single-crystal silicon layer. For every lamination, a certain thickness of the silicon wafer is transferred to the transparent substrate as the single-crystal silicon layer. The silicon wafer is reusable until its thickness is insufficient to form the single-crystal silicon layer.

Preferably the infrared light has a wavelength of 0.7~1.5 μm. Apart from infrared light, a laser is also applicable with a preferable energy range of 50~400 mJ/cm$^2$.

Next, high temperature annealing is performed, followed by chemical mechanical polishing (CMP) to obtain a single-crystal silicon layer 230 having a smooth surface. The preferred annealing temperature is 300~500° C.

According to the method for forming a single-crystal silicon layer on a transparent substrate provided in this invention, the conventional problem of forming a single-crystal silicon layer on a transparent substrate is overcome. This method provides a solution for forming elements on transparent substrates, thus integration of various circuits onto a glass panel (system on panel, SOP) is obtainable. Consequently, TFTs formed by single-crystal silicon layer with enhanced performance may be achieved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art) Therefore, the scope of the appended claims should be accorded the broadest interpretation so as to encompass all such modifications and similar arrangements.

What is claimed is:

1. A method for forming a single-crystal silicon layer on a transparent substrate, comprising:

providing a transparent substrate having an amorphous silicon layer formed thereon and a silicon wafer having a hydrogen ion layer formed therein;

inverting and laminating the silicon wafer onto the amorphous silicon layer so that a layer of single-crystal silicon layer is between the hydrogen ion layer and the amorphous silicon layer; and subjecting the laminated silicon wafer and the amorphous silicon layer to infrared light to cause chemical bonding of the single-crystal silicon layer and the amorphous silicon layer and inducing a hydro-cracking reaction in-situ thereby separating the silicon wafer and the transparent substrate at the hydrogen ion layer, and leaving the single-crystal silicon layer on the transparent substrate.

2. The method as claimed in claim 1, further comprising subjecting the single-crystal silicon layer to high temperature annealing and chemical mechanical polishing thus reconstructing the silicon atoms to form a smooth surface.

3. The method as claimed in claim 1, wherein the transparent substrate is glass, quartz, synthetic quartz, LiNbO3 or LiTaO3.

4. The method as claimed in claim 1, wherein the wavelength of the infrared light is 0.7~1.5.

5. The method as claimed in claim 1, wherein the hydrogen ion layer is formed by doping with a dosage of 1×1016~5×1017 cm-2 and energy of 10~1000 keV.

6. The method as claimed in claim 1, wherein the depth of the hydrogen ion layer is 0.1~15 μm from the surface of the silicon wafer.

* * * * *